(12) United States Patent
Wedel

(10) Patent No.: US 7,538,614 B1
(45) Date of Patent: May 26, 2009

(54) DIFFERENTIAL AMPLIFIER WITH INDEPENDENT OUTPUT COMMON MODE ADJUSTMENT

(75) Inventor: Dale S. Wedel, Loveland, CO (US)

(73) Assignee: Fairchild Semiconductor Corporation, South Portland, ME (US)

( * ) Notice: Subject to any disclaimer, the term of this patent is extended or adjusted under 35 U.S.C. 154(b) by 17 days.

(21) Appl. No.: 11/937,852

(22) Filed: Nov. 9, 2007

(51) Int. Cl.
*H03F 3/45* (2006.01)

(52) U.S. Cl. ........................ 330/258; 330/257

(58) Field of Classification Search .............. 330/257, 330/258, 265, 292, 260

See application file for complete search history.

(56) References Cited

U.S. PATENT DOCUMENTS 7,132,860 B2 * 11/2006 Lehto ..................... 327/52

OTHER PUBLICATIONS

U.S. Appl. No. 11/453,495, Samsung Electronics Co.

* cited by examiner

*Primary Examiner*—Khanh V Nguyen
(74) *Attorney, Agent, or Firm*—Cesari and McKenna, LLP; Edwin H. Paul, Esq.

(57) ABSTRACT

A fully differential amplifier with a high common mode rejection ratio with an independent output voltage setting is disclosed. The amplifier may be arranged with a single ended output or a differential output. The gain may be set by adjusting a resistor without affecting bandwidth of the circuit. The circuit exhibits high speed and may be implemented with various electronic component types. The DC voltage of the output, single ended or differential, may be adjusted by adjusting a reference voltage, wherein the output voltage adjustment does not substantially affect the performance of the differential amplifier.

7 Claims, 3 Drawing Sheets

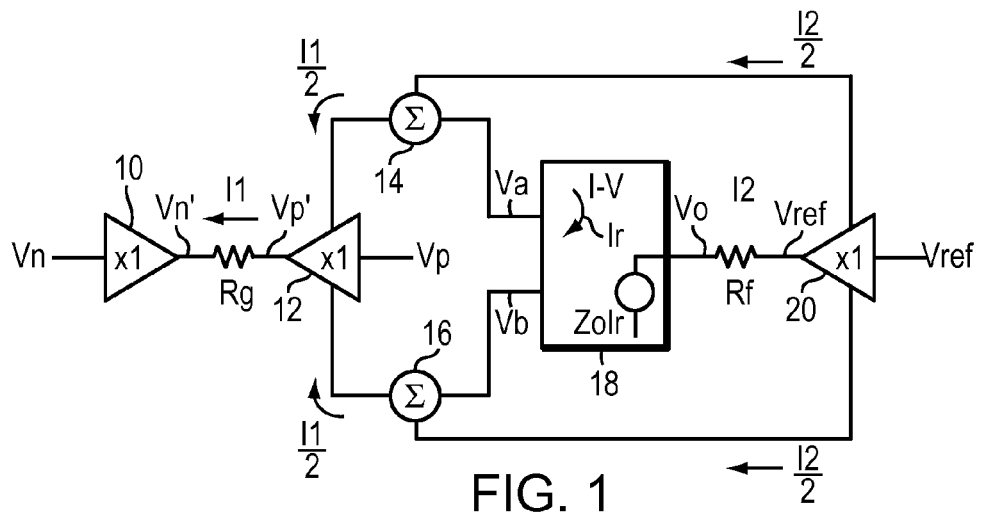
FIG. 1
Eq. 1) $V_o = I_r Z_o$; $Z_o$ TRANSIMPEDANCE VERY HIGH
Eq. 2) $V_o = Z_o \left( \dfrac{V_p - V_n}{R_g} + \dfrac{V_{ref} - V_o}{R_f} \right)$; SOLVING FOR $V_o$
Eq. 3) $V_o = \left[ (V_p - V_n) \dfrac{R_f}{R_g} + V_{ref} \right] \dfrac{Z_o}{R_f + Z_o}$; OR $Z_o \gg R_f$
Eq. 4) $V_o = (V_p - V_n) \dfrac{R_f}{R_g} + V_{ref}$
FIG. 2
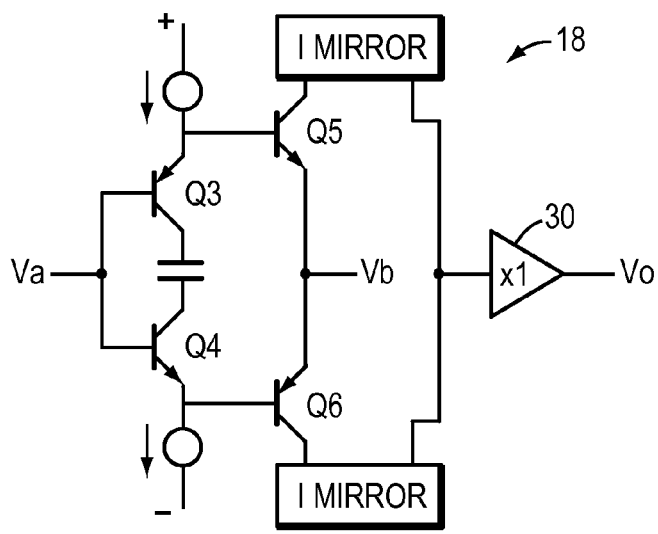
FIG. 3

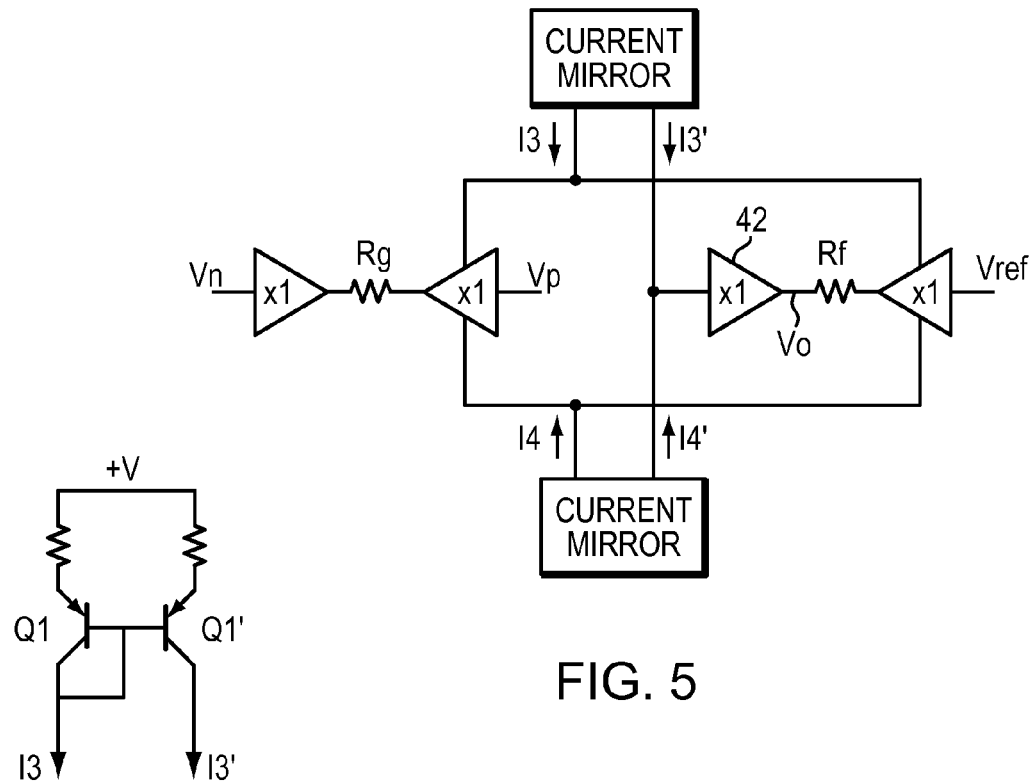
FIG. 5
FIG. 6
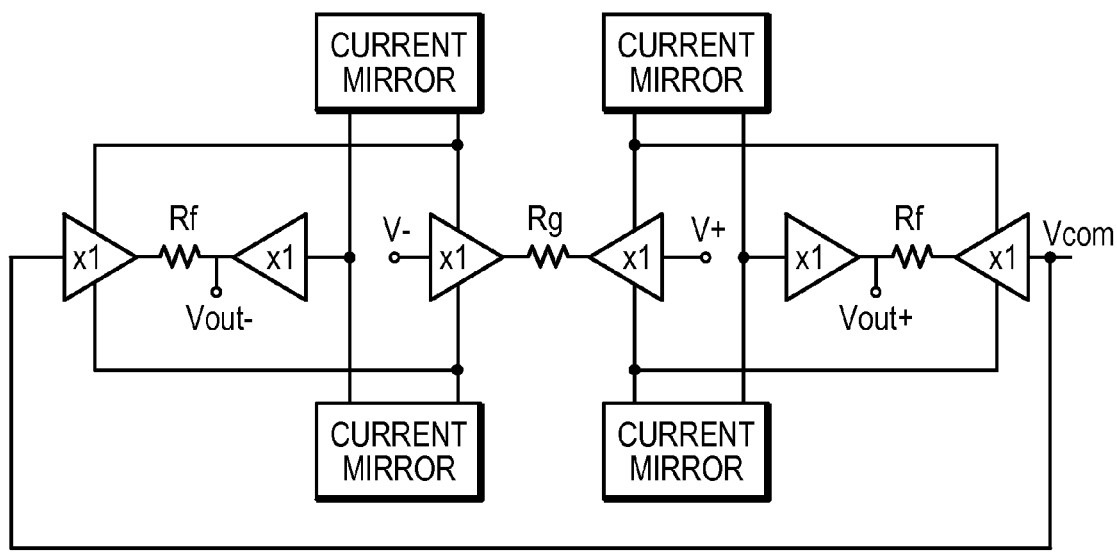
FIG. 7

DIFFERENTIAL AMPLIFIER WITH INDEPENDENT OUTPUT COMMON MODE ADJUSTMENT

BACKGROUND OF THE INVENTION

1. Field of the Invention

The present invention relates to differential amplifiers, and more particularly to differential amplifiers where the output voltage level is an issue with respect to following circuitry.

2. Background Information

Differential analog amplifiers carry information in the input difference signal. The average signal level of the inputs is usually not of interest. However, the average voltage level of the output (commonly called the common mode or CM level) may produce an output voltage level that is inconvenient for following electronics. This may force the circuit to be AC coupled using large capacitors, etc. Inconvenient output voltage levels also may reduce dynamic range. For example, in applications where the output of a differential amplifier drives a circuit referenced between a single supply source and ground, positioning the differential amplifier output level to about mid-range of the supply voltage is often beneficial, but may not be possible without additional level shifting circuitry.

Another limitation may occur when an amplifier is used with feedback. In such an application, the circuit is limited to a gain/bandwidth product where the dynamics of the input stage affects the performance and the stability of the circuit. For example, higher input stage gain may cause oscillations.

Current feedback operational amplifiers have a high slew rate and, typically, are not subject to the gain/bandwidth limitation of voltage operational amplifiers. The bandwidth of a traditional current feedback operational amplifier depends primarily on the value of the feed back resistor. Typically such amplifiers are used in high bandwidth amplifiers, and have characteristics that make it better suited for specific applications, e.g. video signal processing.

Current feedback operational amplifier circuits, however, have other limitations that may make them unsuitable for some applications. For example, they typically have a near zero impedance at the inverting input while the non-inverting input has a near infinite input impedance. Also, the current noise is higher but the voltage noise is lower in current mode operational amplifier circuits.

It would be advantageous to have differential operational amplifiers with high input impedances, that accommodate CM voltages, that independently set output voltage levels, and where gains may be set without changing bandwidths or otherwise affecting amplifier performance.

SUMMARY OF THE INVENTION

In light of the preceding discussion embodiments of the present invention provides, inter alia: a differential amplifier with high input impedances at both the inverting and non-inverting inputs; high common mode rejection ratio (CMRR); independent adjustment of the output voltage level; and an input stage that can be within a closed loop with little impact on stability.

An illustrative embodiment of the present invention provides a reference stage, where the reference voltage is arranged to bias the output voltage as desired without affecting the performance or stability of the amplifier. In this embodiment the reference voltage is buffered to form a ref erence current with the output of the difference amplifier. That current is split and fed back to current summation points. The difference inputs are buffered to form an input current that is split. The split reference and input currents are both input to current summations points where the difference is sent to a transimpedance circuit. The transimpedance device drive the output. The circuit forms a feed back circuit where the DC level of the output is shifted in response to shifting the reference voltage without affecting the performance of the differential amplifier. That is the gain, bandwidth, slew rate, dynamic range of the difference amplifier is not materially affected by the DC or common voltage of the output.

In another embodiment the current summation points are current mirrors and the transimpedance device is a current amplifier, and in another illustrative embodiment, the circuit is augments to form full differential input and differential output circuit. Here a single reference voltage may be use to set the CM level of both differential outputs.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

The invention description below refers to the accompanying drawings, of which:

FIG. 1 is a schematic block diagram illustrating an embodiment of the present invention;

FIG. 2 is set of equations that apply to the circuit of FIG. 1;

FIG. 3 is an illustrative schematic embodiment of the I-V circuit;

FIG. 5 illustrates an alternative embodiment of the invention;

FIG. 6 illustrates basic current mirrors; and

FIG. 7 is an expanded circuit embodiment of the invention illustrating a full differential input and differential output.

DETAILED DESCRIPTION OF AN ILLUSTRATIVE EMBODIMENT

Figure 4:
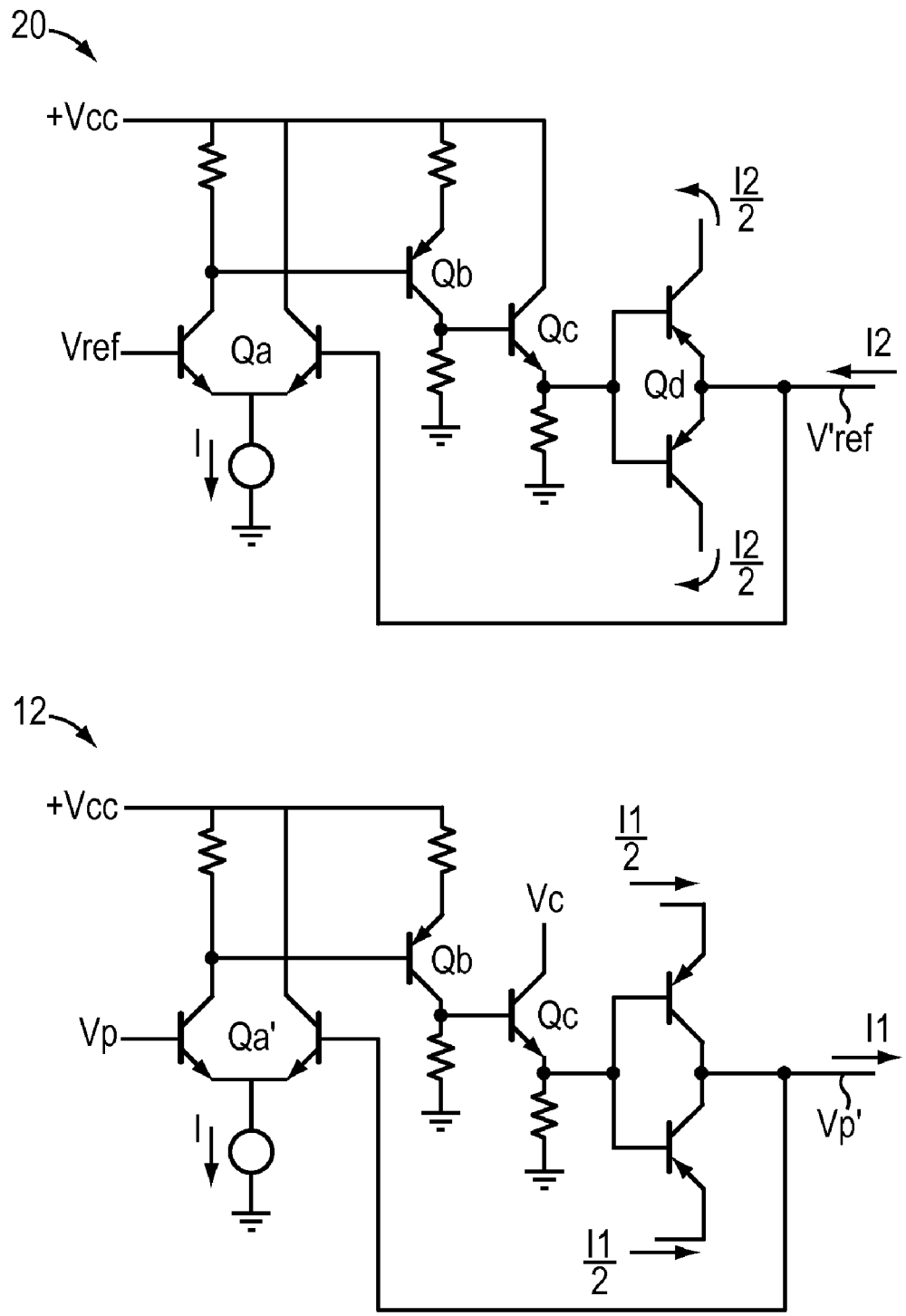
FIG. 4 has illustrative embodiments of the X! amplifiers, items 12 and 20.

FIG. 1 receives a differential input, Vn and Vp, with high input impedance unity gain amplifiers 10 and 12, respectively. Rg, arranged between the outputs of amplifiers 10 and 12, carries a current I1, as shown. The current I1 is supplied from unity gain amplifier 12, half coming from each of the two current summing nodes 14 and 16. Typically in prior art circuits the input impedance is R1 (as in a typical operational amplifier with input (R1) and feed back (R2) resistors. The high input impedances of the present invention are advantageous in practical circuits.

A high transimpedance I-V converter circuit 18 accepts an error current Ir and produces an output voltage signal Vo proportional to Zo(Ir). Zo is a transimpedance (a proportionality factor) where an input current produces a voltage output, in this embodiment Zo is very large.

Another unity gain amplifier 20 receives a reference voltage, Vref. Rf connects the output of the unity gain amplifier 20 to the Vo of the I-V converter circuit. A current I2 is produced through Rf where about half of I2 reaches each of the current summing nodes 14 and 16 via unity gain amplifier 20.

FIG. 2 shows the equations that apply to the circuit of FIG. 1. Eq. 4 shows that the DC voltage level of Vo depends directly on Vref (plus the familiar gain function (Rf/Rg)(Vp−Vn). Advantageously, the DC voltage level of Vo may be set independently by Vref in order to accommodate virtually any following circuitry. Also, by inspection Rg can be used to change gain with no effect on overall bandwidth.

FIG. 3 is a representative block circuit schematic that illustrates an I-V converter 18. The circuit in FIG. 3 may be viewed as a current mode amplifier, but other circuits may be used. Here Va connects to the base of Q3 and Q4 forming a high impedance input, while Vb connects to the emitters of Q5 and Q6 forming a low impedance input. The collector currents of Q5 and Q6 drive current mirrors whose outputs provide Vo via an amplifier 30. Since the I-V 18 is buffered from the FIG. 1 amplifier output and input, feedback around the entire circuit of FIG. 1 may be used without performance loss.

FIG. 4 are illustrative circuit implementations of the unity gain amplifiers 12 and 20 of FIG. 1. For unity gain amplifier 20, a differential NPN transistor pair Qa has Vref input to a base and Vref' input to the other base. A signal is taken from one collector and amplified by Qb and the emitter follower Qc. Qc's output drives the bases of a pair Qd of PNP transistors with their emitters tied together. The emitters form Vref' that is fed back to Qa. The current I2 is fed to the emitters of Qd and is split into the current I2/2 that go back to the current summers 14 and 16 of FIG. 1. Notice that the DC level of Vref' can be set by Vref with affecting the current split of I2.

In FIG. 4, the operation of the unity gain amplifier 10 is similar to that for unity gain amplifier 20, except that Qd' contains NPN transistors and the current enters Qd.'

FIG. 5 illustrates one implementation that replaces the current summing nodes 14 and 16 and the I-V converter 18 circuit with the current mirrors 40 and 40' and the unity gain amplifier 42. The unity gain amplifier 42 may be designed similarly to the unity gain amplifiers of FIG. 4 without the current splitting output transistors of FIG. 4.

FIG. 6 illustrates a typical current mirror where I3' is a mirror of I3. The resistors shown may be omitted in many applications, and in each case the size of the mirror transistors (Q1 and Q1') scale the mirror currents. For example if Q1 is smaller that Q1', I3 will be smaller than I3', as is known to those skilled in the art.

FIG. 7 is a full differential circuit representation. A differential input, Vp−Vn, produces a differential output, (OUT+)−(OUT−). Here Vcom 60 replaces Vref from FIG. 1. Vcom operates to set the DC output voltage level for both OUT+ and OUT−. Vcom operates on both sides of the circuit in FIG. 6, but separate voltages may be input to the unity gain amplifiers 62 and 64 that will produce a settable current through the LOAD resistor or compensate for a DC offset between the input voltage levels. No AC coupling is needed at the outputs or the inputs.

Although the circuitry illustrated herein uses bipolar transistors, the invention may be implemented using CMOS, BiCMOS as would be understood by those skilled in the art.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. A differential amplifier having a differential input and a first output, the differential amplifier comprising:
a differential input stage with an intermediate differential output driving a first resistor that defines a first current; wherein the first current is split into first and second input currents,
a reference stage that defines a reference voltage,
a second resistor functionally connected between the reference voltage and the first output that defines a feedback current, wherein the feedback current is split into first and second feedback currents,
a first current summation circuit that accepts one of the split input currents and one of the split feedback currents and defines an error current,
a second current summation circuit that accepts the other one of the split input currents and the other one of the split feedback currents and also defines the error current,
a high transimpedance converter that accepts the error current outputs the first output, a first output voltage is a function of the error current times a transimpedance, wherein the transimpedance is very large, and wherein varying the reference voltage varies the first output voltage while largely leaving the performance of the differential amplifier unchanged.

2. The differential amplifier of claim 1 wherein the first and the second current summation circuits each comprise a current mirror.

3. The differential amplifier of claim 2 wherein the high transimpedance converter comprises a unity gain high input impedance operational amplifier.

4. The differential amplifier of claim 1 further comprising:
a third resistor functionally connected between the reference voltage and a second output, the second output along with the first output comprising a differential output, wherein the second output defines a second feedback current, wherein the second feedback current is split into third and fourth reference currents,
a third current summation circuit that accepts one of the third and fourth split input currents and one of the third and fourth reference currents and defines a second error current,
a fourth current summation circuit that accepts the other one of the third and fourth split input currents and the other one of the third and fourth split reference currents and also defines the second error current,
a second transimpedance converter that accepts the error current and outputs the second output, wherein the second output is a function of the second error current times the second transimpedance, wherein the second transimpedance is very large, and wherein varying the reference voltage varies the first and the second output voltages while largely leaving the performance of the differential amplifier unchanged.

5. The differential amplifier of claim 4 wherein the first, second, third and fourth current summation circuits each comprise a current mirror.

6. The differential amplifier of claim 5 wherein the first and second transimpedance converters comprise unity gain high input impedance operational amplifiers.

7. The differential amplifier of claim 4 wherein the reference voltage may be split into two reference voltage, the first reference voltage associated with the second resistor and the second reference voltage associated with the third resistor.

* * * * *